United States Patent [19]
Takase et al.

[11] Patent Number: 5,586,078
[45] Date of Patent: Dec. 17, 1996

[54] DYNAMIC TYPE MEMORY

[75] Inventors: Satoru Takase; Kiyofumi Sakurai; Masaki Ogihara, all of Yokohama, Japan

[73] Assignee: Kabushiki Kaisha Toshiba, Kawasaki, Japan

[21] Appl. No.: 528,306

[22] Filed: Sep. 14, 1995

[30]  Foreign Application Priority Data

Sep. 22, 1994 [JP] Japan .................................. 6-227639

[51] Int. Cl.$^6$ ........................................................ G11C 8/00
[52] U.S. Cl. ............................ 365/230.03; 365/189.02; 365/189.05
[58] Field of Search .......................... 365/230.03, 189.02, 365/189.05

[56]  References Cited

U.S. PATENT DOCUMENTS 5,301,162  4/1994  Shimizu ............................. 365/230.03
5,384,745  1/1995  Konishi et al. .................... 365/230.03

FOREIGN PATENT DOCUMENTS

0428785A1   5/1991   European Pat. Off. .
0454998A2  11/1991   European Pat. Off. .

Primary Examiner—David C. Nelms
Assistant Examiner—Trong Phan
Attorney, Agent, or Firm—Banner & Witcoff, Ltd.

[57]  ABSTRACT

A DRAM includes memory blocks in a form of division of shared sense amplifier configuration in which sub arrays and sense amplifiers serving as cache memories are alternately arranged in the X direction of a memory chip. The memory blocks are arranged in the Y direction. Data lines are formed in parallel with the Y direction for the corresponding sub arrays, for transferring data held in the sense amplifiers corresponding to the sub arrays. I/O pads are arranged in parallel with the X direction, for inputting/outputting data to/from the corresponding sub arrays via the data lines. When the shared sense amplifier configuration and sense amplifier cache system are achieved in a small area of the DRAM, the hit rate of the cache memories is increased, and data can be transferred at high speed by shortening data paths formed in the memory chip.

10 Claims, 7 Drawing Sheets

DYNAMIC TYPE MEMORY

BACKGROUND OF THE INVENTION

1. Field of the Invention

The present invention relates to a semiconductor memory device and, more specifically, to a dynamic type memory or a dynamic RAM (DRAM) capable of transferring data at high speed through an input/output path.

2. Description of the Related Art

In a dynamic type memory, a divided cell array operating system is employed wherein a memory cell array is divided into a plurality of cell arrays (sub arrays) and some of the cell arrays are operated at the same time. This system makes it possible to reduce a charge/discharge current of bit lines which occupies a large part of the consumed current in an operation of rows. The number of sub arrays has a close relation to the operation speed of the memory. If each sub array is large in size, the capacity of word lines is increased too much and thus the rise and fall speeds of the word lines are decreased. Since the capacity of bit lines is also increased too much, a difference in potential between a pair of bit lines is lessened, and the speed at which the potential difference is amplified by a sense amplifier becomes slow, with the result that the operation speed of the entire memory is decreased. For this reason, as the memory is miniaturized and its capacity is increased, the number of sub arrays is likely to increase in order to reduce the charge/discharge current of the bit lines and then prevent the operation speed of the entire memory from lowering.

A dynamic RAM (DRAM) is achieved at low cost as a memory which is employed in bulk in a computer system. In the field of computers, the operation speed of a microprocessor (MPU) is remarkably improved and thus becomes higher and higher than that of the DRAM. The improvement in speed of data transfer between the MPU and DRAM is an important factor in increasing the processing speed of the total computer system. Various improvements have been made to increase the data transfer speed, and a typical one of them is to adopt a high-speed memory or a cache memory. The memory, which is interposed between the MPU and the main memory to shorten the difference between the cycle time of the MPU and the access time of the main memory, improves in efficiency in use of the MPU.

As examples of the cache memory, there are a static RAM (SRAM) of a chip separated from both a MPU chip and a DRAM chip, an SRAM called an on-chip cache memory or an embedded memory mounted on an MPU chip (an MPU chip mounted with a cache memory may have an SRAM cache memory of another chip), and an SRAM cell mounted on a DRAM chip.

The technique of mounting a cache memory including SRAM cells on a DRAM chip, is disclosed in "A Circuit Design of Intelligent CDDRAM with Automatic Write Back Capability," 1990 Symposium on VLSI Circuits, Digest of Technical Papers, pp 79–80. According to this technique, an SRAM cell is added to each column of a DRAM using cells each having one transistor and one capacitor, and this SRAM cell is employed as a cache memory. Moreover, when data of an address to be accessed is not stored in the cache memory (mishit), the data of the cache memory is written back to a DRAM cell corresponding to the address, and then data stored in a DRAM cell of an address to be accessed are read out into the cache memory. This cache memory mounted DRAM can be employed together with a cache memory mounted MPU.

The technique of using sense amplifiers of bit lines of a DRAM as cache memories is disclosed in Japanese Patent Application No. 3-41316 (Jpn. Pat. Appln. KOKAI Publication No. 4-212780) whose applicant is the same as that of the present application. A specific constitution of the cache memories and a specific control operation thereof are disclosed in Japanese Patent Application No. 3-41315 whose applicant is also the same as that of the present application.

Furthermore, Japanese Patent Application No. 4-131095, the applicant of which is the same as that of the present application, proposes a DRAM wherein a memory region is divided into a plurality of sub arrays, the sub arrays are operated independently of one another, and sense amplifiers of bit lines are employed as cache memories, thereby enhancing the hit rate of the cache memories.

Since, in this DRAM, a sense amplifier holds data read out from a row corresponding to each of different addresses for each of the sub arrays, a hit possibility of requesting access to a selected row can be increased, and the average of data access time, which depends on both the hit possibility and mishit possibility of not requesting the access, can be reduced.

A cache memory system using sense amplifiers will now be described in brief. Assume that a DRAM stands by for access from an MPU and, in this case, data read out from memory cells of a row address is latched in the sense amplifiers.

If, there is access to the row address, data of whose memory cells is latched in the sense amplifiers (hit), the data can be output only by the operation of columns without that of rows, and access time necessary for the operation of rows can be shortened accordingly.

In contrast, if there is access to a row address, data of whose memory cells is not latched in the sense amplifiers (mishit), it is necessary that the data of the sense amplifiers is written back to the memory cells (or the sense amplifiers are equalized), and then data of a new row address be latched in the sense amplifiers. In this mishit case, the access time is much longer than when no cache memory system is employed.

If the hit rate of the cache memories is low, the average access time of the system is lengthened. To increase the hit rate is therefore important for shortening the average access time of the system.

In order to enhance the foregoing hit rate, there is a first method of increasing the capacity of each of the cache memories or a second method of dividing the cache memories into some banks.

If the first method is applied to the cache memory system using sense amplifiers, the sense amplifiers, which stand by for access while latching data, are increased in number. Generally, as described above, a large-capacity memory performs partial activation of activating some of sub arrays at the same time and, in this case, no data is usually held in the sense amplifiers related to the sub arrays in which an operation of rows is not performed. If, however, these sense amplifiers are caused to latch data, the sense amplifiers standing by for access while latching data, can be increased in number, as can be the capacity of the cache memories, thereby enhancing the hit rate.

If the above second method is applied to the cache memory system using sense amplifiers, these sense amplifiers are divided into a plurality of banks. In a versatile DRAM, generally, the sense amplifiers related to a plurality of sub arrays operate simultaneously to perform sensing, latching, and equalizing operations at the same timing, while the sense amplifiers related to the sub arrays in which an operation of rows is not performed, as described above, are allowed to stand by while latching data. The simultaneously-operating sense amplifiers are called banks. In order to divide 10 the sense amplifiers into banks for the purpose of increasing the hit rate of the cache memories, the following conditions are required:

(1) Each bank has independent sense amplifiers.
(2) The sense amplifiers of a bank, in which an operation of rows is not performed, are able to continue latching data of the bank, irrespective of row addresses of the other banks.
(3) Each bank includes data paths corresponding to all I/O pads since a specific bank is accessed to access a certain cache memory, whereas in a multi-bit DRAM, data has to be supplied from the accessed bank to the I/O pads at the same timing.

Figure 4:
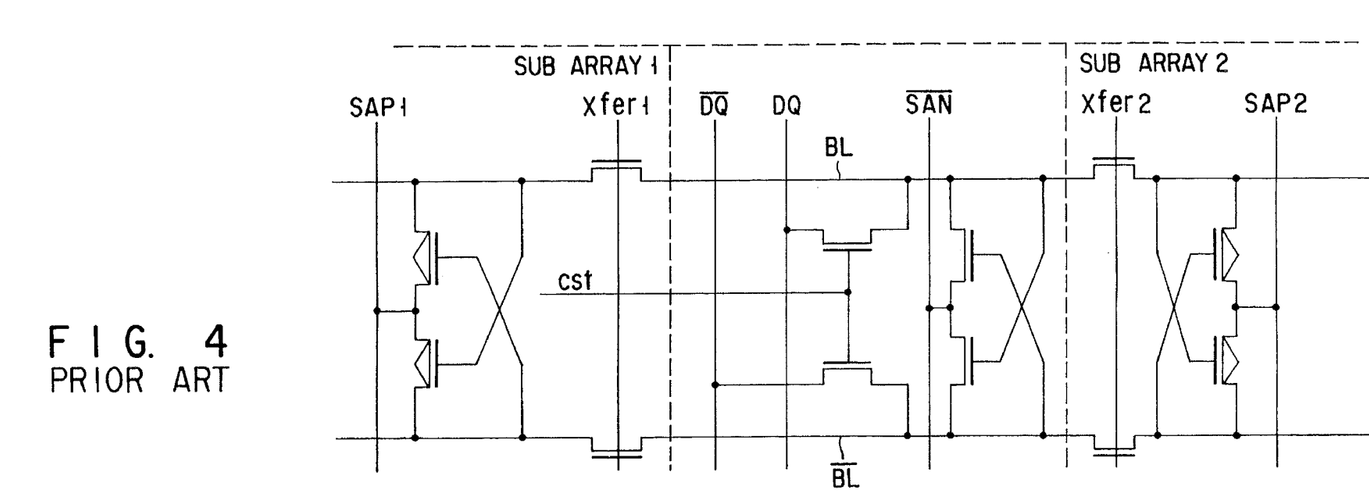
FIG. 4 is a circuit diagram of a shared sense amplifier according to a shared sense amplifier configuration of a conventional DRAM.

A shared sense amplifier configuration is known to reduce the area of a memory chip. In this system, as shown in FIG. 4, a sense amplifier 62 constituted of sensing NMOS transistors and restoring PMOS transistors is provided between two sub arrays 61, and the two sub arrays 61 are selectively connected to the single sense amplifier 62 by controlling data transfer transistors in response to control signals Xfer1 and Xfer2, thereby time-divisionally using the single sense amplifier 62 by the two sub arrays 61.

The above shared sense amplifier configuration has been actually adopted in a large-capacity memory such as a 16-Mbit memory to decrease the chip area. The efficiency in configuration in this system will now be 10 described with reference to schematic views of FIGS. 5 and 6.

Figure 5:
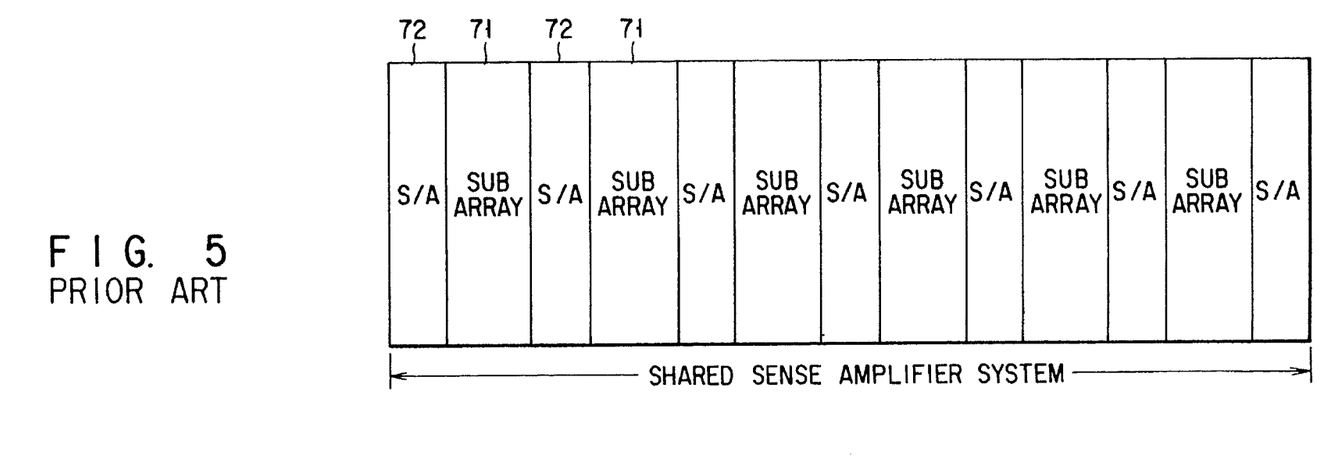
FIG. 5 is a view of an example of the shared sense amplifier configuration of the conventional DRAM.
Figure 6:
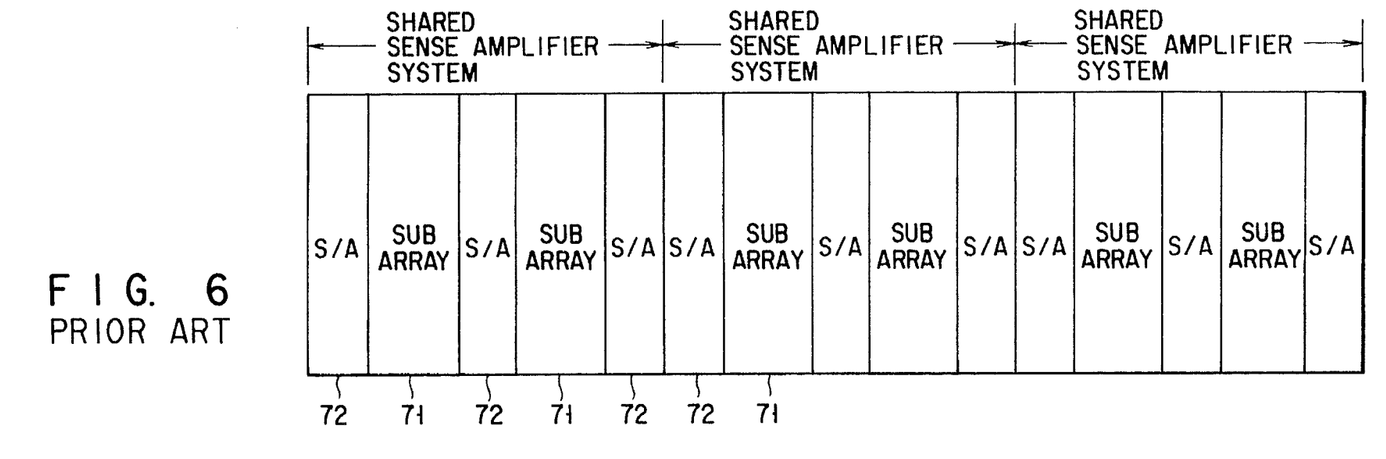
FIG. 6 is a view of another example of the shared sense amplifier configuration of the conventional DRAM.

The configuration shown in FIG. 5 is more efficient than that shown in FIG. 6. More specifically, since the configuration of FIG. 6 includes contiguous sense amplifiers 72, the number of sense amplifiers in FIG. 6 is larger than that of sense amplifiers in FIG. 5, with the result that the chip area is increased and the configuration efficiency is lowered.

Figure 7:
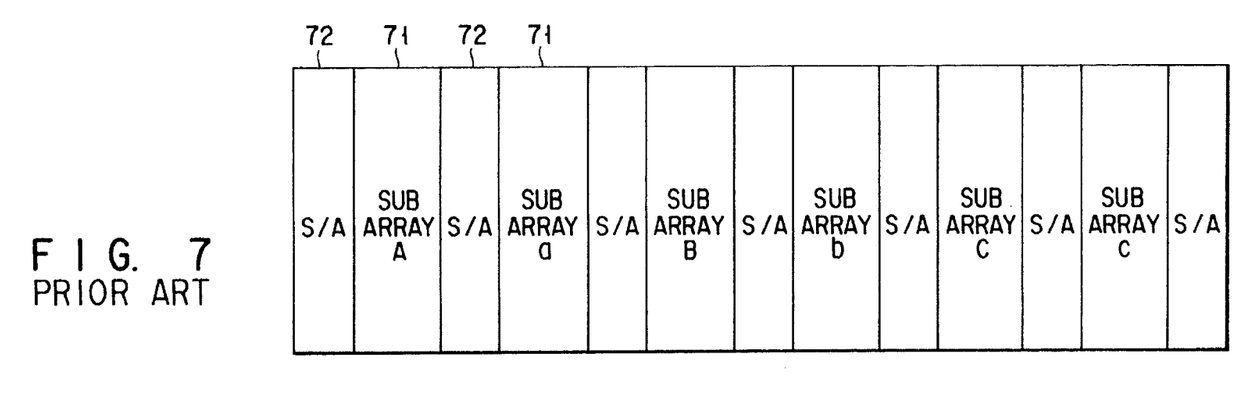
FIG. 7 is a view of the arrangement of sense amplifiers and sub arrays in a system for activating the sub arrays to increase the capacity of cache memories when a sense amplifier cache system is applied to the conventional DRAM.

If the cache memory system using the sense amplifiers is applied to the configuration shown in FIG. 5 to increase the capacity of the cache memory, the configuration as shown in FIG. 7 is obtained. More specifically, half the sub arrays 71 (A, B, C) or 71 (a, b, c) are activated, and data is latched by sense amplifiers 72 excluding a sense amplifier at one end of the configuration in FIG. 7, thereby increasing the number of sense amplifiers which stand by for access while latching the data.

In the shared sense amplifier configuration shown in FIG. 7, however, the sub arrays A and a cannot be divided into different banks since the foregoing condition (1) is not satisfied, nor can be the sub arrays a and B since they share a sense amplifier with each other and thus the condition (1) is not satisfied. It is thus understood that in the shared sense amplifier configuration as shown in FIG. 7, the sub arrays cannot be divided into banks.

In other words, the sub arrays have to be separate in order to group the sub arrays into banks in the shared sense amplifier configuration. This lessens the effect of reduction in chip area due to high configuration efficiency which is advantageous to the shared sense amplifier configuration.

Figure 8:
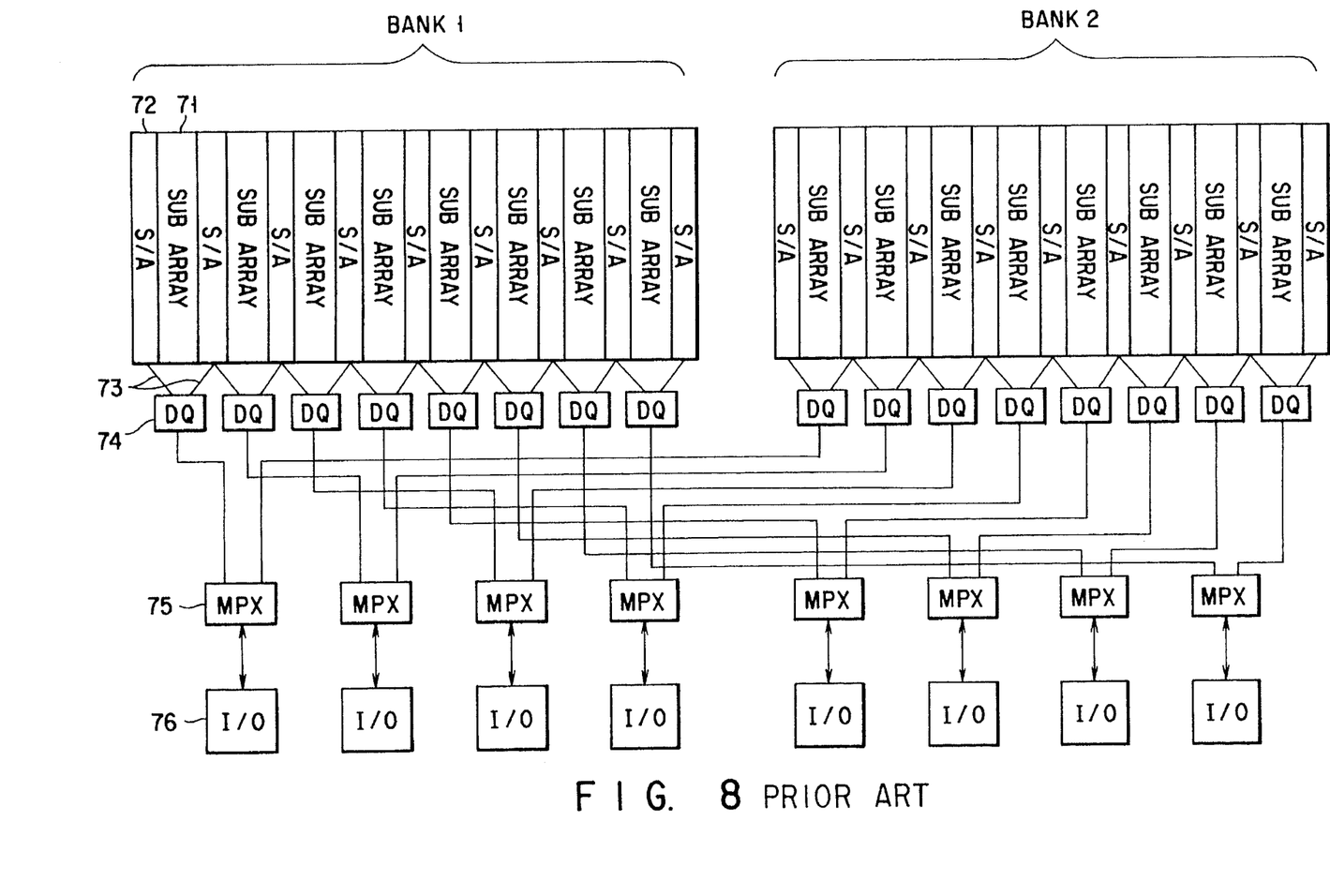
FIG. 8 is a view of the arrangement of sense amplifiers and sub arrays in two banks into which a shared sense amplifier configuration is divided when a lateral-direction array division system is applied to the conventional DRAM.

If an array is divided into sub arrays in its lateral direction, as in the conventional case, and the sub arrays are separate to group the sub arrays into two banks 1 and 2, a shared sense amplifier configuration shown in FIG. 8 is obtained.

The configuration shown in FIG. 8 employs a vertical surface mounting package (VSMP) in which all I/O pads 76 for inputting/outputting data having bit number corresponding to a bit configuration are collectively provided on one side of the array of the sub arrays and vertically mounted on a memory chip mounting printed circuit board. By using the VSMP, a lead frame inside the package and wires on the circuit board can be shortened and thus data can be transferred at high speed.

In the configuration shown in FIG. 8, data lines 73 are provided for each of sub arrays 71 and connected to a data buffer (DQ buffer) 74 corresponding to each of the sub arrays. Each multiplexer (MPX) 75 is 10 connected to corresponding data buffers 74 of the banks 1 and 2. The number of multiplexers 75 is equal to that of I/O pads 76.

If the configuration shown in FIG. 8 becomes larger and larger, both the sub arrays 71 and sense amplifiers 72 are increased in number. This may cause a problem, taking into consideration that the sub arrays are likely to increase in number as the DRAM increases in capacity as described above. The problem is that data paths for connecting the DQ buffers 74 and multiplexers 75 are lengthened thereby to prevent data from being transferred at high speed in the memory chip.

As described above, the conventional DRAM has the problem wherein a long data path prevents high-speed data transfer if the cache memories are increased in number and divided into plural banks in order to enhance the hit rate of the cache memories in the shared sense amplifier configuration with high configuration efficiency.

In the conventional DRAM, the enhancement of the hit rate and the high-speed data transfer are incompatible to achieve the shared sense amplifier configuration or the sense amplifier cache memory system in a small area.

SUMMARY OF THE INVENTION

The present invention has been developed in order to resolve the above problems. An object of the invention is to provide a dynamic type memory capable of enhancing the hit rate of a cache memory and increasing the speed of data transfer by shortening data paths formed in a chip when a shared sense amplifier configuration and a sense amplifier cache memory system are achieved in a small area. Another object of the invention is to provide a high-performance, low-cost dynamic type memory having the advantages of both a shared sense amplifier configuration and a sense amplifier cache memory system.

According to the present invention, there is provided a dynamic type memory of a shared sense amplifier structure comprising:

a plurality of memory cell blocks arranged in a second direction on a semiconductor chip, each constituting a memory cell bank and including a plurality of sub arrays in a form of division of a memory cell array and a plurality of sense amplifiers used as cache memories, the sub arrays and the sense amplifiers being alternately arranged in a first direction perpendicular to the second direction, with one of the sense amplifiers being on each end of an arrangement of the sub arrays and the sense amplifiers, each of the sub arrays having a plurality of dynamic type memory cells arranged in a matrix, a plurality of word lines each connected to those of the memory cells which are in a row and a plurality of bit lines each connected to those of the memory cells which are in a column, each of the sense amplifiers including a plurality of amplifier circuits connected to the bit lines, each of the amplifier circuits for sensing and amplifying a potential read out from a memory cell when a corresponding bit line is selected;

a plurality of data lines provided to the sub arrays, the data lines being arranged on the semiconductor chip and extending in the second direction, each of the data lines for transferring data sensed and amplified by an amplifier circuit of a sense amplifier of a corresponding sub array, the bit line connected to which amplifier circuit is selected; and a plurality of input/output pads provided to the sub arrays of the banks, the input/output pads being in an arrangement in the first direction on the semiconductor chip, the arrangement being located in one side of the memory cell array.

The dynamic type memory of the present invention may further comprise a plurality of data buffer circuits provided to the sub arrays of the memory blocks, each for amplifying data transferred via a corresponding data line of a corresponding sub array, the data buffer circuits being in an arrangement in 10 the first direction on the semiconductor chip and a plurality of multiplexers being in an arrangement in the first direction on the semiconductor chip, the arrangement of the multiplexers being between the arrangement of the input/output pads and the arrangement of the data buffer circuits which are closest to input/output pads, each of the multiplexers being connected to a corresponding sub array of each of the banks.

Alternatively, the dynamic type memory of the present invention may comprise a plurality of data buffer and multiplexer circuits arranged in the first direction on the semiconductor chip, an arrangement of the data buffer and multiplexer circuits being between the arrangement of the input/output pads and that of the memory blocks which are closest to the input/output pads.

It is desirable in the dynamic type memory of the present invention that those of the data lines which are provided to the sub arrays of one of the memory blocks are arranged over the sense amplifiers of another of the memory blocks which is nearer to the input/output pads than the one memory block.

It is also desirable in the dynamic type memory of the present invention that those of the data lines which are provided to the sub arrays of one of the memory blocks have a size larger than that of those of the data lines which are provided for sub arrays of another of the memory blocks which is nearer to the input/output pads than the one memory block.

It is further preferable in the dynamic type memory of the present invention that each of the sense amplifiers is shared in a time division manner by two of the sub arrays adjacent thereto.

In the present invention, a plurality of memory blocks each having a shared sense amplifier configuration are arranged as a plurality of banks along the second direction of a memory chip which is perpendicular to the first direction in which sub arrays and sense amplifiers are arranged alternately. Thus, a sense amplifier cache memory system in which the sense amplifiers are used as cache memories, can be adopted.

Since, in this case, each of multiplexers is connected to a plurality of data lines of corresponding sub arrays of different banks, data of the banks can be multiplexed and data of each bank can be read out independently. Sine each bank has data paths connected to all I/O pads, the hit rate of the cache memories can be increased.

The sense amplifiers perform their operations (e.g., sensing, latching and equalizing operations) at the same timing, while the sense amplifiers, which correspond to the sub arrays standing by for access, are set to keep holding the data sensed so far. The capacity of the cache memories can thus be increased, as can be the hit rate thereof.

While all the data lines extend in parallel to the second direction of the memory chip, the multiplexers and I/O pads are arranged locally on one side of the memory chip in the first direction which is perpendicular to the second direction.

As described above, since the data lines, multiplexers and I/O pads are arranged with efficiency, the data paths formed in the memory chip are shortened, with the result that data can be transferred at high speed.

The sub arrays and sense amplifiers are arranged alternately, one of the sense amplifiers is located at each end of each memory block, and one sense amplifier interposed between two sub arrays is time-divisionally used by the two sub arrays. The DRAM having such an efficient shared sense amplifier configuration can thus be achieved in a small area.

Consequently, according to the present invention, a high-performance, low-cost DRAM having the advantages of both the shared sense amplifier configuration and sense amplifier cache memory system, can be attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFEREED EMBODIMENTS

Embodiments of the invention will now be described with reference to the accompanying drawings.

Figure 1:
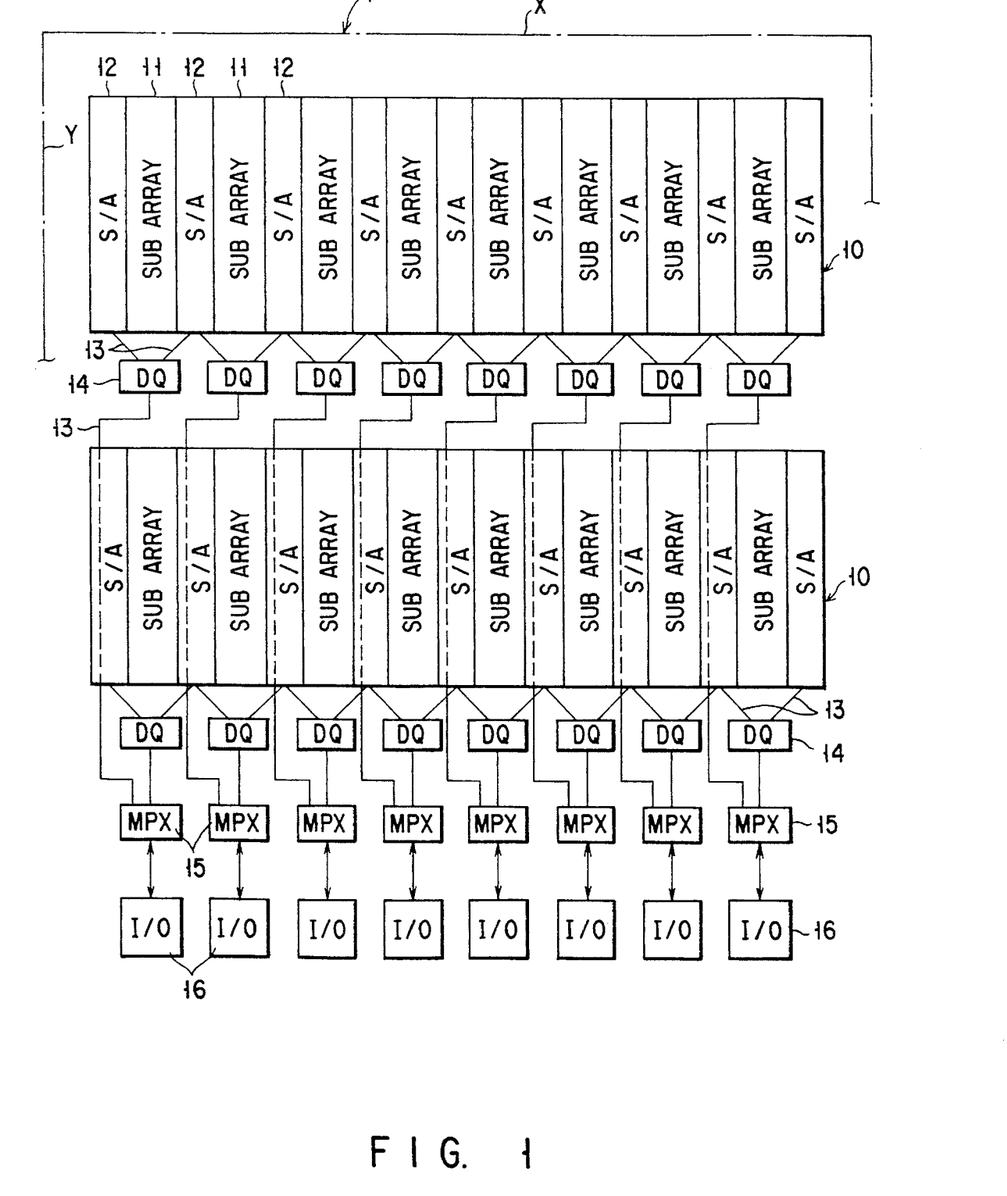
FIG. 1 is a view of the arrangement of sub arrays, sense amplifiers, DQ buffers, multiplexers and I/O pads in a chip of a DRAM according to a first embodiment of the present invention.
Figure 2:
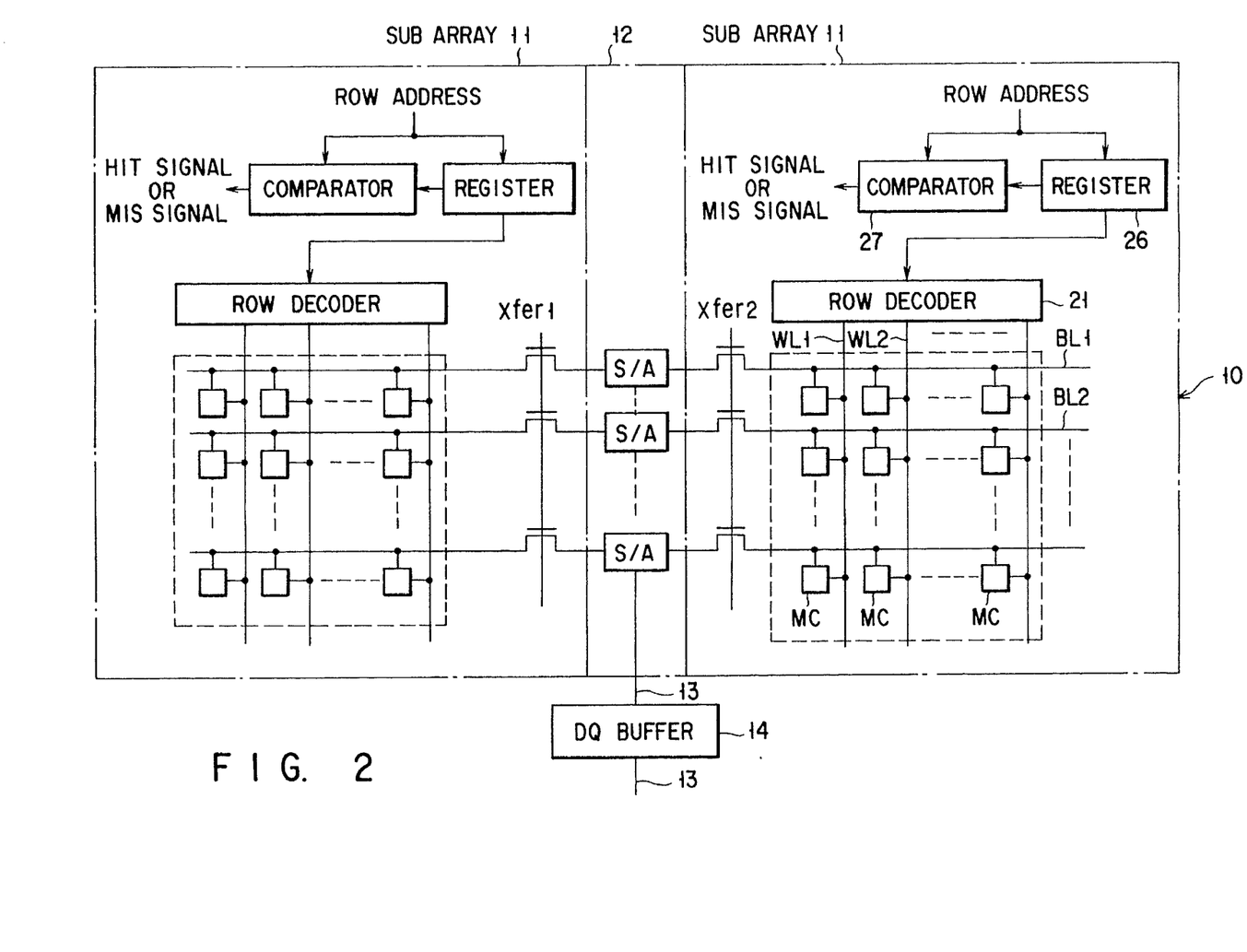
FIG. 2 is a circuit diagram showing part of the arrangement of FIG. 1 including two sub arrays, one sense amplifier and one DQ buffer.

FIG. 1 shows an example of the arrangement of sub arrays 11, sense amplifiers (SA) 12, data buffers (DQ) 14, multiplexers (MPX) 15 and input/output pads (I/O) 16 of a memory cell array of a memory chip 1 of a DRAM according to a first embodiment of the present invention, and FIG. 2 shows part of the arrangement of FIG. 1 which includes two sub arrays 11, one sense amplifier 12 and one data buffer 14. Referring to FIG. 1, a plurality of memory blocks 10 (two memory blocks 10 in this embodiment) of a shared sense amplifier configuration each include sub arrays 11 and sense amplifiers 12 which are arranged alternately in a second direction X of the chip 1 (in the lateral direction of FIG. 1). It is sense amplifiers 12 that located at both ends of each memory block 10. One sense amplifier 12 is used time-divisionally by two sub arrays 11 interposing the sense amplifier 12, which means the shared-sense amplifier configuration. Such a configuration has been described above with reference to, for example, FIG. 4.

The memory blocks 10 are arranged in a first direction Y (in the longitudinal direction) which is perpendicular to the second direction X. Thus, the DRAM is controlled as a plurality of banks (two banks in this embodiment) corresponding to the blocks. The banks are designated (selected) in response to a decoded signal of a bank address.

As illustrated in FIG. 2, each of the sub arrays 11 includes an array of dynamic memory cells MC arranged in matrix, a plurality of word lines WL (WL1, WL2, . . . ) connected to the memory cells MC on their respective rows, and a plurality of bit lines BL (BL1, BL2, . . . ) connected to the memory cells MC on their respective columns. Each of the word lines WL is selected by a row decoder 21 for decoding a row address, while each of the bit lines BL is selected by a column selection circuit (not shown) in response to a decoded signal output from a column decoder (not shown) for decoding a column address, with the result that one memory cell MC is selected. The memory cells MC of each sub array are therefore selected by sequentially selecting the row and column addresses.

The sense amplifiers 12, which are operated at the same timing, amplifies the potential read out from memory cells MC of a selected row in the accessed sub array 11, and continue holding the data sensed so far (standing by to output) in the sub array 11 standing by for access. In this way, the sense amplifiers are employed as cache memories.

To continue holding the sensed data, a circuit has only to be formed to allow control signals/SAN and SAP for activating the sense amplifier circuits, as shown in FIG. 4, to remain activated.

A plurality of data lines 13 are formed for the corresponding sense amplifiers 12 in parallel with the first direction Y of the memory chip 1 and used to transfer that data of a selected column which is stored in the sense amplifiers 12. Of the data lines 13 of two different banks 10 as shown in FIG. 1, data lines 13 extending from the bank located far from the I/O pads 16, pass over the sense amplifiers 12 of the other bank located near to the I/O pads.

The I/O pads 16 are common to the plural banks 10 and arranged on one side of the memory cell array in parallel with the second direction X of the memory chip. Data is input/output to/from the I/O pads 16 and their corresponding sub arrays 11 through the data lines 13.

The data buffers (DQ buffers) 14 are arranged on one side of each block, which is near to the I/O pads 16, in parallel with the second direction X, so as to correspond to the sub arrays 11. These data buffers are inserted between the data lines 13 and I/O pads 16 to amplify data supplied from the corresponding sub arrays 11.

As illustrated in FIG. 1, the multiplexers 15 are arranged between the data buffers 14 and I/O pads 16 in parallel with the second direction X and each connected to the corresponding two data buffers 14 of the two banks 10 through the corresponding data lines 13. These multiplexers selectively extract data from the banks 10.

It is not desirable that the data lines 13 of the two banks 10 are connected directly to each other, since a load capacity of the data lines 13 is increased, as is a delay in data transfer.

In this embodiment, therefore, the multiplexers 15 are each constituted by switching elements (e.g., MOS transistors) connected in series between the corresponding I/O pad 16 and data lines 13 of the different banks, with the result that data can be input/output selectively to/from the different banks.

Furthermore, in the sense amplifier cache memory system, as disclosed in Japanese Patent Application No. 4-31095, each of the sub arrays includes a register 26 for holding a row address (corresponding to a selected row) and a comparator 27 for comparing the row address held in the register 26 with a new row address.

When a sub array is supplied with an access request and a row address, the comparator 27 compares the two row addresses described above. If they coincide with each other, the comparator outputs a hit signal, and data of a column corresponding to a column address is output without any operation of the rows. If they do not coincide, it outputs a mishit signal, and the register 26, word line and sense amplifier are reset and then the new row address is set in the register circuit 26. The rows are operated in accordance with the new row address held in the register circuit 26. The sub array is supplied again with an access request and a row address to determine whether a hit or a mishit occurs. In the case of hit, data of a column corresponding to a column address is read out without any operation of the rows. The above operations are performed in the plurality of sub arrays 11 by sequentially supplying the sub arrays 11 with an access request. In each of the sub arrays 11, only the row in which a mishit occurs can be selected and thus all the rows need not be selected every time a mishit occurs.

The data lines 13 of the bank located far from the I/O pads 16 are longer than those of the bank located near to the I/O pads. It is thus desirable that the former data lines be made thicker than the latter ones in order to make the wiring resistances of the former and latter data lines 13 approximately equal to each other by suppressing an increase in the wiring resistance of the former data lines.

In the foregoing DRAM of the first embodiment, the memory blocks 10 each having the shared sense amplifier configuration are arranged as two banks in the direction Y which is perpendicular to the direction X in which the sub arrays 11 and sense amplifiers 12 are arranged alternately. Thus, sense amplifier cache memory system using the sense amplifiers as cache memories can be applied to the DRAM.

Since one multiplexer 15 is connected to two data buffers 14 of the corresponding sub arrays 11 of the different two banks, data of these banks can be multiplexed and data of each bank can be read independently. Sine, moreover, each bank has data paths connected to all the I/O pads 16, the hit rate of the cache memories can be increased.

The sense amplifiers 12 perform their operations (e.g., sensing, latching and equalizing operations) at the same timing, and the sense amplifiers 12, which correspond to the sub arrays standing by for access, are set to keep holding the data sensed so far. Therefore, the capacity of the cache memories can be increased, as can be the hit rate thereof.

While all the data lines 13 extend in parallel to the first direction Y of the memory chip, the multiplexers 15 and I/O pads 16 are arranged on one side of the memory cell array in parallel with the second direction X.

As described above, since the data lines 13, multiplexers 15 and I/O pads 16 are arranged with efficiency, the data paths formed in the memory chip are shortened, with the result that data can be transferred at high speed.

The sub arrays 11 and sense amplifiers 12 are arranged alternately to constitute a memory block, one of the sense amplifiers is located at each end of the memory block, and one sense amplifier 12 interposed between two sub arrays 11 is time-divisionally used by the two sub arrays 11. Since the DRAM of the first embodiment has such an efficient shared sense amplifier configuration, it can be achieved in a small area.

Consequently, according to the first embodiment, a high-performance, low-cost DRAM having the advantages of both the shared sense amplifier configuration and sense amplifier cache memory system, can be achieved.

Figure 3:
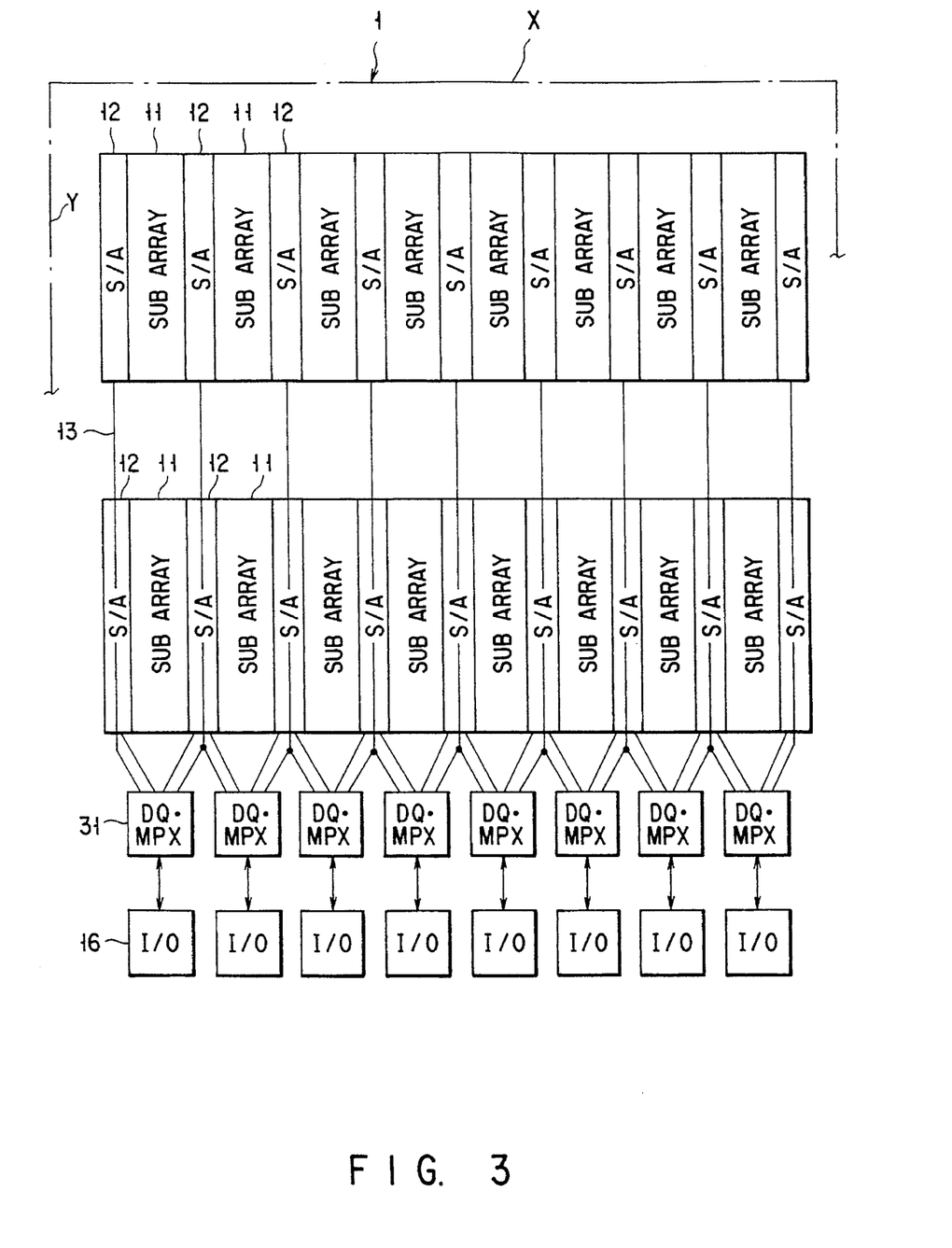
FIG. 3 is a view of the arrangement of sub arrays, sense amplifiers, DQ buffers, multiplexers and I/O pads in a chip of a DRAM according to a second embodiment of the present invention.

FIG. 3 shows an example of the arrangement of sub arrays 11, sense amplifiers 12, data buffers/multiplexers 31 and input/output pads 16 of a memory chip of a DRAM according to a second embodiment of the present invention.

The second embodiment differs from the first embodiment in that the data buffers/multiplexers 31 are employed in place of the data buffers 14 and multiplexers 14 of the first embodiment. The data buffers/multiplexers 31 are interposed between the I/O pads 16 and their adjacent memory block 10 and arranged in parallel with the second direction X of the memory chip. Each of the data buffers/multiplexers 31 is connected to a plurality of data lines 13 of the corresponding sub arrays 11 of different banks to selectively amplify and extract the data output from the banks. The elements other than the data buffers/multiplexers 31 are the same as those of the first embodiment and thus denoted by the same reference numerals.

Specifically, a plurality of memory blocks 10 (two memory blocks 10 in this embodiment) of a shared sense amplifier configuration each include sub arrays 11 and sense amplifiers 12 which are arranged alternately in a second direction X of the chip 1 (in the lateral direction of FIG. 3). It is sense amplifiers 12 that located at both ends of each memory block 10. One sense amplifier 12 is used time-divisionally by two sub arrays 11 interposing the sense amplifier 12, which means the shared sense amplifier configuration. Such a configuration has been described above with reference to, for example, FIG. 4.

The memory blocks 10 are arranged in a first direction Y (in the longitudinal direction) which is perpendicular to the second direction X. Thus, the DRAM is controlled as a plurality of banks (two banks in this embodiment) corresponding to the blocks. The banks are designated (selected) in response to a decoded signal of a bank address.

As illustrated in FIG. 2, each of the sub arrays 11 includes an array of dynamic memory cells MC arranged in matrix, a plurality of word lines WL (WL1, WL2, . . . ) connected to the memory cells MC on their respective rows, and a plurality of bit lines BL (BL1, BL2, . . . ) connected to the memory cells MC on their respective columns. Each of the word lines WL is selected by a row decoder 21 for decoding a row address, while each of the bit lines BL is selected by a column selection circuit (not shown) in response to a decoded signal output from a column decoder (not shown) for decoding a column address, with the result that one memory cell MC is selected. The memory cells MC of each sub array are therefore selected by sequentially selecting the row and column addresses.

The sense amplifiers 12, which are operated at the same timing, amplifies the potential read out from memory cells MC of a selected row in the accessed sub array 11, and continue holding the data sensed so far (standing by to output) in the sub array 11 standing by for access. In this way, the sense amplifiers are employed as cache memories.

To continue holding the sensed data, a circuit has only to be formed to allow control signals/SAN and SAP for activating the sense amplifier circuits, as shown in FIG. 4, to remain activated.

Figure 9:
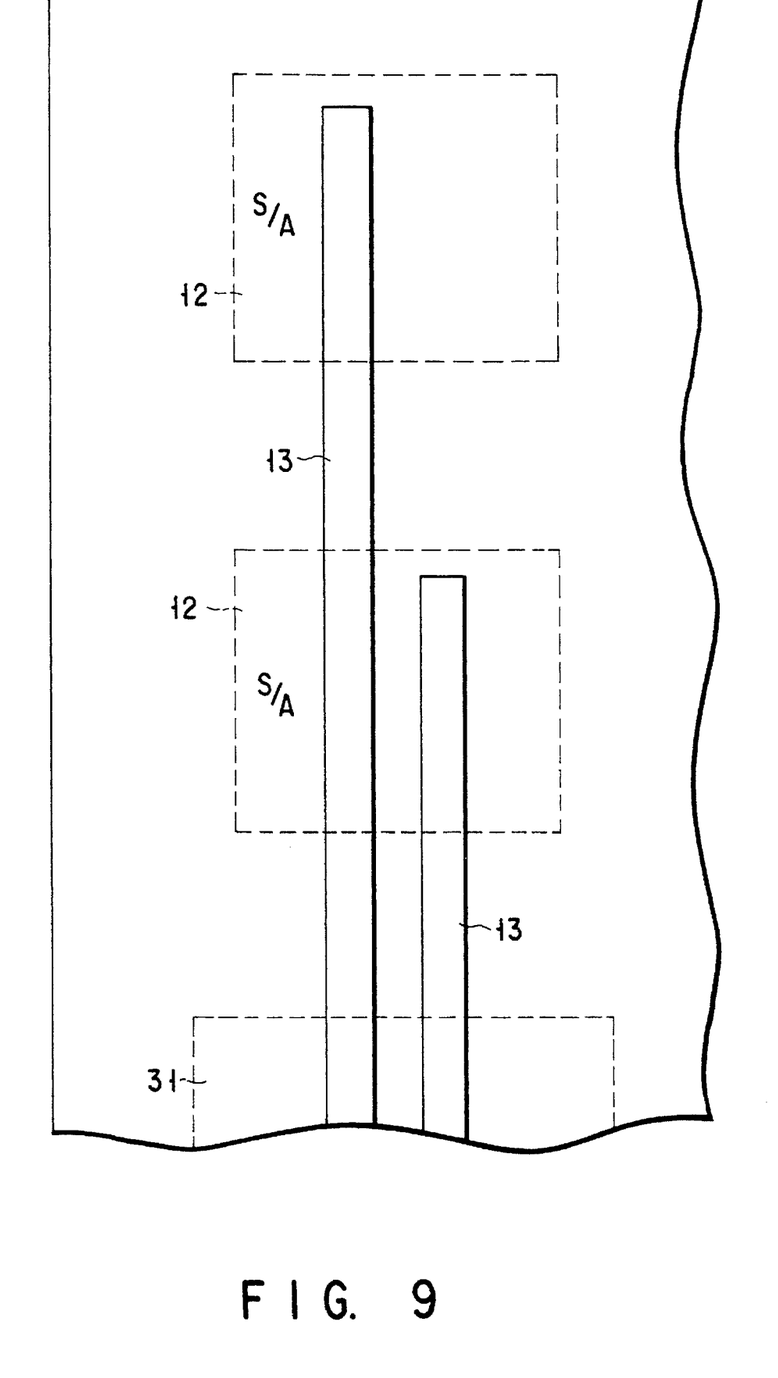
FIG. 9 is a partial pattern view of the arrangement shown in FIG. 3.

A plurality of data lines 13 are formed for the corresponding sense amplifiers 12 in parallel with the second direction Y of the memory chip 1 and used to transfer that data of a selected column which is stored in the sense amplifiers 12. Of the data lines 13 of two different banks 10 as shown in FIG. 3, data lines 3 extending from the bank located far from the I/O pads 16, pass over the sense amplifiers 12 of the other bank located near to the I/O pads. FIG. 9 is a partial pattern view of the arrangement of FIG. 3, in which the data line 13 extending from the far located bank and the data line 13 extending from the near located bank are formed on the same insulation film. The data line 13 extending from the far located bank passes over the sense amplifier region of the near located bank.

The I/O pads 16 are common to the plural banks 10 and arranged on one side of the memory cell array in parallel with the second direction X of the memory chip. Data is input/output to/from the I/O pads 16 and their corresponding sub arrays 11 through the data lines 13.

The data buffers/multiplexers 31 are interposed between the I/O pads 16 and their adjacent memory block 10 and arranged in parallel with the second direction X of the memory chip. Each of the data buffers/multiplexers 31 is connected to a plurality of data lines 13 of the corresponding sub arrays 11 of different banks to selectively amplify and extract the data output from the banks.

It is not desirable that the data lines 13 of the two banks 10 are connected directly to each other, since a load capacity of the data lines 13 is increased, as is a delay in data transfer.

In this embodiment, therefore, the multiplexer portions are each constituted by switching elements (e.g., MOS transistors) connected in series between the corresponding I/O pad 16 and data lines 13 of the different banks, with the result that data can be input/output selectively to/from the different banks.

Furthermore, in the sense amplifier cache memory system, as disclosed in Japanese Patent Application No. 4-131095, each of the sub arrays includes a register 26 for holding a row address (corresponding to a selected row) and a comparator 27 for comparing the row address held in the register 26 with a new row address.

When a sub array is supplied with an access request and a row address, the comparator 27 compares the two row addresses described above. If they coincide with each other, the comparator outputs a hit signal, and data of a column corresponding to a column address is output without any operation of the rows. If they do not coincide, it outputs a mishit signal, and the register 26, word line and sense amplifier are reset and then the new row address is set in the register circuit 26. The rows are operated in accordance with the new row address held in the register circuit 26. The sub array is supplied again with an access request and a row address to determine whether a hit or a mishit occurs. In the case of hit, data of a column corresponding to a column address is read out without any operation of the rows. The above operations are performed in the plurality of sub arrays 11 by sequentially supplying the sub arrays 11 with an access request. In each of the sub arrays 11, only the row in which a mishit occurs can be selected and thus all the rows need not be selected every time a mishit occurs.

In the foregoing DRAM of the second embodiment (FIG. 3), the memory blocks 10 each having the shared sense amplifier configuration are arranged as two banks in the direction Y which is perpendicular to the direction X in which the sub arrays 11 and sense amplifiers 12 are arranged alternately. Thus, sense amplifier cache memory system using the sense amplifiers as cache memories can be applied to the DRAM.

Since one data buffer/multiplexer 31 is connected to the corresponding sub arrays 11 of the different two banks, data of these banks can be multiplexed and data of each bank can be read independently. Sine, moreover, each bank has data paths connected to all the I/O pads 16, the hit rate of the cache memories can be increased.

The sense amplifiers 12 perform their operations (e.g., sensing, latching and equalizing operations) at the same timing, and the sense amplifiers 12, which correspond to the sub arrays standing by for access, are set to keep holding the data sensed so far. Therefore, the capacity of the cache memories can be increased, as can be the hit rate thereof.

While all the data lines 13 extend in parallel to the second direction Y of the memory chip, the data buffers/multiplexers 31 and I/O pads 16 are arranged on one side of the memory cell array in parallel with the second direction X.

As described above, since the data lines 13, data buffers/multiplexers 15 and I/O pads 16 are arranged with efficiency, the data paths formed in the memory chip are shortened, with the result that data can be transferred at high speed.

The sub arrays 11 and sense amplifiers 12 are arranged alternately to constitute a memory block, one of the sense amplifiers is located at each end of the memory block, and one sense amplifier 12 interposed between two sub arrays 11 is time-divisionally used by the two sub arrays 11. Since the DRAM of the first embodiment has such an efficient shared sense amplifier configuration, it can be achieved in a small area.

Consequently, according to the second embodiment, a high-performance, low-cost DRAM having the advantages of both the shared sense amplifier configuration and sense amplifier cache memory system, can be achieved.

The data lines 13 of the bank located far from the I/O pads 16 are longer than those of the bank located near to the I/O pads. It is thus desirable that the former data lines be made thicker than the latter ones in order to make the wiring resistances of the former and latter data lines 13 approximately equal to each other by suppressing an increase in the wiring resistance of the former data lines.

The DRAM of the second embodiment is able to perform the same operation as that of the DRAM of the first embodiment and produce substantially the same advantage as that of the DRAM of the first embodiment.

In the aforementioned DRAM of the present invention, when a small-area or small-sized memory chip having both a shared sense amplifier configuration and a sense amplifier cache memory system is formed, the hit rate of the cache memories can be increased, and data can be transferred at high speed by shortening the data paths in the memory chip. In other words, the DRAM of the present invention is capable of having the advantages of both the shared sense amplifier configuration and sense amplifier cache memory system.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A dynamic type memory of a shared sense amplifier structure comprising:

a plurality of memory cell blocks arranged in a first direction on a semiconductor chip, each constituting a memory cell bank and including a plurality of sub arrays of a memory cell array and a plurality of sense amplifiers used as cache memories, the sub arrays and the sense amplifiers being alternately arranged in a second direction perpendicular to said first direction, with one of the sense amplifiers being on each end of an arrangement of the sub arrays and the sense amplifiers, each of said sub arrays having a plurality of dynamic type memory cells arranged in a matrix, a plurality of word lines each connected to those of the memory cells which are in a row and a plurality of bit lines each connected to those of the memory cells which are in a column, each of the sense amplifiers including a plurality of amplifier circuits connected to the bit lines, each of the amplifier circuits for sensing and amplifying a potential read out from a memory cell when a corresponding bit line is selected;

a plurality of data lines provided to said sub arrays, the data lines being arranged on said semiconductor chip and extending in said first direction, each of the data lines for transferring data sensed and amplified by an amplifier circuit of a sense amplifier of a corresponding sub array; and a plurality of input/output pads provided to the sub arrays of the banks, the input/output pads being in an arrangement in said second direction on said semiconductor chip, the arrangement being located on one side of said memory cell array.

2. A dynamic type memory according to claim 1, further comprising a plurality of data buffer circuits provided to the sub arrays of said memory blocks, each for amplifying data transferred via a corresponding data line of a corresponding sub array, the data buffer circuits being in an arrangement in said second direction on said semiconductor chip and a plurality of multiplexers being in an arrangement in said second direction on said semiconductor chip, the arrangement of the multiplexers being between said arrangement of the input/output pads and the arrangement of the data buffer circuits which are closest to input/output pads, each of the multiplexers being connected to a corresponding sub array of each of said banks.

3. A dynamic type memory according to claim 1, further comprising a plurality of data buffer and multiplexer circuits arranged in said second direction on said semiconductor chip, an arrangement of said data buffer and multiplexer circuits being between said arrangement of the input/output pads and that of said memory blocks which are closest to the input/output pads.

4. A dynamic type memory according to claim 1, wherein those of said data lines which are provided to the sub arrays of one of said memory blocks are arranged over the sense amplifiers of another of said memory blocks which is nearer to said input/output pads than said one memory block.

5. A dynamic type memory according to claim 2, wherein those of said data lines which are provided to the sub arrays of one of said memory blocks are arranged over the sense amplifiers of another of said memory blocks which is nearer to said input/output pads than said one memory block.

6. A dynamic type memory according to claim 3, wherein those of said data lines which are provided to the sub arrays of one of said memory blocks are arranged over the sense amplifiers of another of said memory blocks which is nearer to said input/output pads than said one memory block.

7. A dynamic type memory according to claim 1, wherein those of said data lines which are provided to the sub arrays of one of said memory blocks have a size larger than that of those of the data lines which are provided for sub arrays of another of said memory blocks which is nearer to said input/output pads than said one memory block.

8. A dynamic type memory according to claim 2, wherein those of said data lines which are provided to the sub arrays of one of said memory blocks have a size larger than that of those of the data lines which are provided for sub arrays of another of said memory blocks which is nearer to said input/output pads than said one memory block.

9. A dynamic type memory according to claim 3, wherein those of said data lines which are provided to the sub arrays of one of said memory blocks have a size larger than that of those of the data lines which are provided for sub arrays of another of said memory blocks which is nearer to said input/output pads than said one memory block.

10. A dynamic type memory according to claim 1, wherein each of the sense amplifiers is shared in a time division manner by two of the sub arrays adjacent thereto.

* * * * *